(12) United States Patent
Hiramatsu et al.

(10) Patent No.: US 9,666,599 B2
(45) Date of Patent: May 30, 2017

(54) DISPLAY DEVICE HAVING A MULTILAYERED UNDERCOATING LAYER OF SILICON OXIDE AND SILICON NITRIDE

(71) Applicant: Japan Display Inc., Minato-ku (JP)

(72) Inventors: Masato Hiramatsu, Tokyo (JP); Yasushi Kawata, Tokyo (JP); Arichika Ishida, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/513,653

(22) Filed: Oct. 14, 2014

(65) Prior Publication Data

US 2015/0108488 A1 Apr. 23, 2015

(30) Foreign Application Priority Data

Oct. 17, 2013 (JP) .................... 2013-216298

(51) Int. Cl.
| | | |
|---|---|---|
| H01L 27/14 | (2006.01) | |
| H01L 29/04 | (2006.01) | |
| H01L 29/15 | (2006.01) | |
| H01L 31/036 | (2006.01) | |
| H01L 27/12 | (2006.01) | |

(52) U.S. Cl.
CPC ................. H01L 27/1218 (2013.01)

(58) Field of Classification Search
CPC .................................................. H01L 27/1218
See application file for complete search history.

(56) References Cited

U.S. PATENT DOCUMENTS

| | | | | |
|---|---|---|---|---|
| 5,686,360 A | * | 11/1997 | Harvey, III | ......... H01L 51/0097 438/126 |
| 2002/0140347 A1 | * | 10/2002 | Weaver | ................. H01L 25/047 313/506 |
| 2005/0153476 A1 | | 7/2005 | Park et al. | |
| 2007/0232005 A1 | | 10/2007 | Maruyama et al. | |
| 2016/0018094 A1 | * | 1/2016 | Bower | ..................... G09G 3/32 362/382 |

FOREIGN PATENT DOCUMENTS

JP 2005-202398 7/2005

OTHER PUBLICATIONS

Office Action issued Jan. 19, 2017; in corresponding Chinese Patent No. 201410553294.0 (with English-language Translation).

\* cited by examiner

*Primary Examiner* — Stephen W Smoot
*Assistant Examiner* — Vicki B Booker
(74) *Attorney, Agent, or Firm* — Oblon, McClelland, Maier & Neustadt, L.L.P.

(57) ABSTRACT

According to one embodiment, a display device includes an underlying insulation layer formed on a surface of a resin layer, and a thin-film transistor formed above the surface of the resin layer via the underlying insulation layer. The underlying insulation layer includes a three-layer multilayer structure of a first silicon oxide film, a silicon nitride film formed above the first silicon oxide film, and a second silicon oxide film formed above the silicon nitride film.

11 Claims, 4 Drawing Sheets

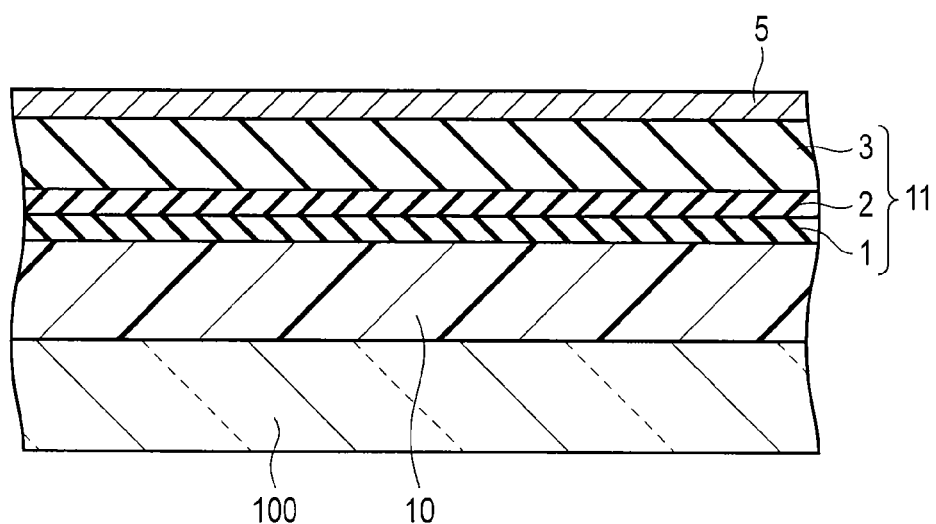
F I G. 2

| | Evaluation objects | Minimum bend R (Downward) | Minimum bend R (Upward) |
|---|---|---|---|
| Example 1 | Multilayer member of resin layer/ underlying insulation layer/a-Si layer Thickness of first silicon oxide film: 50 nm | 2 [mm] | 2 [mm] |
| Example 2 | Multilayer member of resin layer/ underlying insulation layer/a-Si layer Thickness of first silicon oxide film: 10 nm | 2 [mm] | 2 [mm] |
| Example 3 | Multilayer member of resin layer/ underlying insulation layer/a-Si layer Thickness of first silicon oxide film: 30 nm | 2 [mm] | 2 [mm] |
| Example 4 | Multilayer member of resin layer/ underlying insulation layer/a-Si layer Thickness of first silicon oxide film: 100 nm | 2 [mm] | 2 [mm] |
| Comparative example 1 | Resin layer alone | 2 [mm] | 2 [mm] |
| Comparative example 2 | Multilayer member of resin layer/ second silicon oxide film | 2 [mm] | 2 [mm] |
| Comparative example 3 | Multilayer member of resin layer/silicon nitride film/second silicon oxide film/a-Si layer | 25 [mm] | 30 [mm] |

FIG. 3

DISPLAY DEVICE HAVING A MULTILAYERED UNDERCOATING LAYER OF SILICON OXIDE AND SILICON NITRIDE

CROSS-REFERENCE TO RELATED APPLICATIONS

This application is based upon and claims the benefit of priority from Japanese Patent Application No. 2013-216298, filed Oct. 17, 2013, the entire contents of which are incorporated herein by reference.

FIELD

Embodiments described herein relate generally to a display device.

BACKGROUND

By virtue of such advantageous features as light weight, small thickness and low power consumption, flat-panel display devices, such as an organic electroluminescence (EL) display device and a liquid crystal display device, have been used in various fields of OA (office automation) equipment, information terminals, timepieces, and television receivers. In particular, by virtue of high responsivity, display devices using thin-film transistors (TFTs) are widely used as monitors of mobile terminals, computers, etc., which display a great deal of information.

In recent years, as regards mobile information terminal devices such as mobile phones and PDAs (personal digital assistants), there has been an increasing demand for a display device having a less thickness and a less weight, from the standpoint of design and portability, as well as performance. For example, display devices, which realize thinner structures, have been proposed. As a method of realizing a less thickness and less weight, there is known a technique wherein a resin layer formed of a polyimide with a relatively high heat resistance, or a plastic substrate, is used in place of a glass substrate. When a resin layer is formed of a polyimide, a resin layer using a polyimide is formed on a glass substrate. After TFTs, etc. are formed on the resin layer, the resultant structure is divided into cells, and at last the resin layer is peeled from the glass substrate. Thereby, the resin layer can be formed.

BRIEF DESCRIPTION OF THE DRAWINGS

FIG. 2 is a cross-sectional view which schematically illustrates a part of the display device in a manufacturing process of the display device, FIG. 2 illustrating a state in which a resin layer, an underlying insulation layer and an a-Si layer are stacked on a glass substrate.

FIG. 3 is a view showing, in a table, evaluation objects and minimum bend R in Examples 1 to 4 of a second embodiment and Comparative Examples 1 to 3.

DETAILED DESCRIPTION

Figure 1:
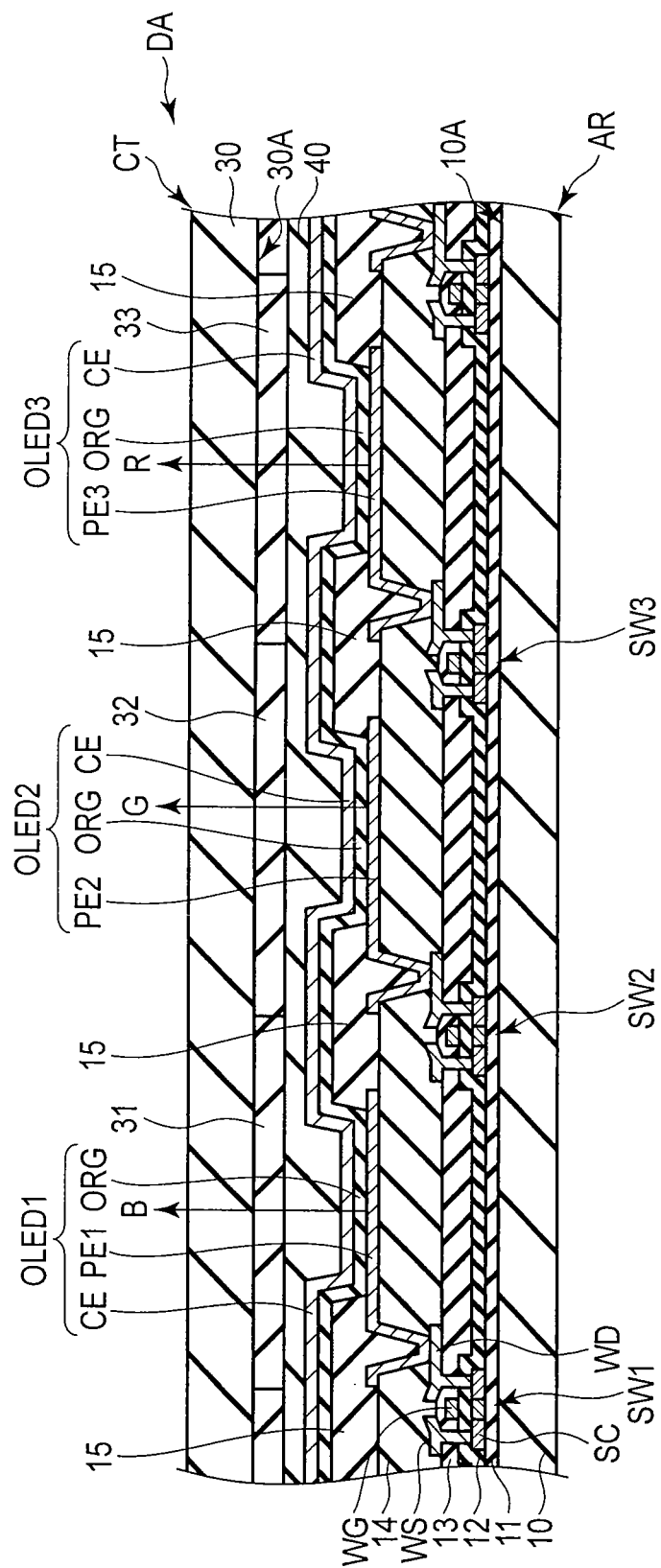
FIG. 1 is a cross-sectional view which schematically illustrates a display device of a first embodiment.

In general, according to one embodiment, there is provided a display device comprising: an underlying insulation layer formed on a surface of a resin layer; and a thin-film transistor formed above the surface of the resin layer via the underlying insulation layer. The underlying insulation layer includes a three-layer multilayer structure of a first silicon oxide film, a silicon nitride film formed above the first silicon oxide film, and a second silicon oxide film formed above the silicon nitride film.

To begin with, the basic concept of embodiments of the invention is described.

A display device is formed, for example, by forming a TFT (thin-film transistor) above a glass substrate or a resin layer. An undercoating layer is provided between the glass substrate or resin layer and the TFT. The undercoating layer is provided in order to prevent contamination of the TFT (diffusion of impurities from the glass substrate or resin layer into the TFT). In addition, the undercoating layer is an underlying insulation layer and is electrically isolated from the TFT.

For example, in the case of forming the display device by using the glass substrate and forming the TFT by using Si (silicon), the undercoating layer is formed, for example, on the glass substrate, and the TFT is formed above the glass substrate via the undercoating layer. The undercoating layer includes a two-layer multilayer structure, and includes a $SiN_X$ film (silicon nitride film) and a $SiO_2$ film (silicon oxide film). The $SiN_X$ film is formed on the glass substrate, and the $SiO_2$ film is formed on the $SiN_X$ film. Since $SiN_X$ and $SiO_2$ are inorganic materials, for example, the $SiN_X$ film and $SiO_2$ film are formed by using a plasma CVD (chemical vapor deposition) method.

The advantage and disadvantage of the $SiN_X$ film are described below.

Advantage: Since the $SiN_X$ film has excellent ion blocking properties, contamination of the TFT can be prevented.

Disadvantage: In a case where a Si layer is formed immediately above the $SiN_X$ film, there is a case in which the electrical characteristics of the TFT are adversely affected and the use of the TFT as a switching element becomes difficult. The reason for this is that when the Si layer is made polycrystalline, nitrogen atoms (excess nitrogen) of structural elements of the $SiN_X$ film are supplied into the Si layer. Since the above has the same function as an N-type dopant, the Si layer is undesirably made to have a function of discharging electrons. In other words, nitrogen atoms function as donors in the Si layer, and an electric current tends to easily flow when an electric current is not to be caused to flow. Furthermore, in other words, even in the condition in which the channel region of the Si layer has to be made to have high resistance, a leak current flowing in the channel region increases.

Next, the advantages and disadvantage of the $SiO_2$ film are described.

Advantage 1: The affinity with the Si layer is excellent.

Advantage 2: The effect at a time of impurity doping is small.

Advantage 3: The supply of nitrogen atoms (excess nitrogen) from the $SiN_X$ film to the Si layer can be prevented.

Disadvantage: The contribution to the prevention of contamination of the TFT is poor.

Next, a description is given of a manufacturing method for forming an undercoating layer and a TFT using p-Si (polysilicon) on a glass substrate.

In this case, the undercoating layer and a-Si (amorphous silicon) layer are, in many cases, formed at the same opportunity. For example, in the same CVD reaction chamber in which the temperature of a glass substrate is about 400° C., three layers, namely a $SiN_X$ film, a $SiO_2$ film and an a-Si layer, are successively formed in order on the glass substrate by only switching supply gases. The $SiN_X$ film is formed on the glass substrate by plasma decomposition of a mixture gas of $SiH_4$ gas and $NH_3$ gas. The $SiO_2$ film is formed on the $SiN_X$ film by plasma decomposition of a mixture gas of $SiH_4$ gas and $N_2O$ gas. The a-Si layer is formed on the $SiO_2$ film by plasma decomposition of $SiH_4$ gas. Subsequently, an ordinary fabrication process of a TFT using low-temperature p-Si will be performed.

As has been described above, when the TFT is formed above the glass substrate, the undercoating layer is formed of two layers, namely the $SiN_X$ film and $SiO_2$ film. Thereby, a display device with excellent product reliability can be obtained.

In the meantime, among display devices, a display device including, in place of the glass substrate, a substrate formed of a material with good flexibility has been developed. This aims at obtaining a display device which is excellent in product reliability and is excellent in flexibility (i.e. is hardly crackable). Furthermore, this display device is advantageous, for example, in that the product design is not restricted, unlike a display device including a glass substrate.

In general, there are the following two kinds of fabrication methods of the substrate with excellent flexibility.

(1) A plastic substrate (resin substrate) is used in place of the glass substrate.

(2) A resin layer (e.g. a resin layer using a polyimide) is formed on the glass substrate, and the resin layer is peeled from the glass substrate. Thereby, this resin layer is used in place of the glass substrate.

In addition, also in the case of forming the display device by using the plastic substrate or resin layer, the undercoating layer is formed on the plastic substrate or resin layer in order to prevent contamination of the TFT. The TFT is formed above the plastic substrate or resin layer via the undercoating layer. Besides, in this case, it can be thought that the undercoating layer is formed of two layers, namely a $SiN_X$ film and a $SiO_2$ film. The $SiN_X$ film is formed on the surface of the resin layer (the surface of the plastic substrate or the surface of the resin layer), and the $SiO_2$ film is formed on the $SiN_X$ film.

However, when the $SiN_X$ film is formed on the surface of the resin layer as described above, such a problem arises that the resin layer (in particular, a surface of the resin layer) changes in quality. The change in quality, in this context, means that the resin layer is hardened and the flexibility (softness) of the resin layer is lost. If the resin layer changes in quality, the resin layer becomes fragile and a crack (brittle fracture) tends to easily occur. Thus, even if the display device is formed by replacing glass with resin, it is difficult to obtain the display device having excellent flexibility.

The reason for this is that when the $SiN_X$ film is formed, the surface of the resin layer, which is heated up to a high temperature of about 400° C., is exposed to $NH_3$ gas having a high reducing property. Incidentally, even when the $SiN_X$ film was formed without using $NH_3$ gas, a change in quality occurred in the resin layer (the surface of the resin layer). For example, even if the $SiN_X$ film is formed by plasma decomposition of a mixture gas of $SiH_4$ gas and $N_2$ gas, a change in quality occurs in the resin layer (the surface of the resin layer). In addition, even if the a-Si film is formed by plasma decomposition of $SiH_4$ gas alone, a change in quality occurs in the resin layer (the surface of the resin layer). From the above, it was understood that a change in quality occurs in the resin layer (the surface of the resin layer) if the resin layer (the surface of the resin layer) is exposed to a reducing atmosphere.

As is understood from the above, in the above-described method of forming the undercoating layer (underlying insulation layer), it is difficult to obtain a display device with excellent flexibility.

In the embodiment of the present invention, a display device with excellent flexibility and product reliability can be obtained, so that the above problem can be solved. Next, the means and method for solving the above problem will be described.

Next, a display device of a first embodiment will be described in detail with reference to the accompanying drawings. In the embodiment, an organic EL display device is described as an example of a sheet-shaped display device.

Incidentally, the disclosure is merely an example, and easily conceivable proper changes within the spirit of the invention are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. In addition, in the specification and drawings, the same elements as those described in connection with preceding drawings are denoted by like reference numerals, and a detailed description thereof is omitted unless otherwise necessary.

As illustrated in FIG. 1, an organic EL display device DA adopts an active matrix driving method, and includes an array substrate AR and a counter-substrate CT. The array substrate AR is formed by using a resin layer 10. The array substrate AR includes switching elements SW1 to SW3 and organic EL elements OLED1 to OLED3 above an inner surface 10A of the resin layer 10.

The resin layer 10 is an insulation layer, which is formed of, for example, a material containing a polyimide (PI) as a main component. The resin layer 10 has a thickness of, e.g. 5 to 30 μm. It is preferable to use, as the material of the resin layer 10, a material with a high heat resistance such as a polyamide-imide or polyaramide, as well as the polyimide.

The inner surface 10A of the resin layer 10 is covered with an underlying insulation layer 11 serving as a first insulation film. Specifically, the underlying insulation layer 11 is an undercoating layer, and is formed on the surface of the resin layer 10. The underlying insulation layer 11 functions as an inner surface barrier film for suppressing entrance of ionic impurities from the resin layer 10 or entrance of moisture via the resin layer 10. The underlying insulation layer 11 is formed of an inorganic material, and is formed of, for example, a multilayer member of a $SiN_X$ film (silicon nitride film) and a $SiO_2$ film (silicon oxide film). The underlying insulation layer 11 may be formed by further including a SiON film (silicon oxynitride film). Incidentally, the underlying insulation layer 11 will be described later in detail.

The switching elements SW1 to SW3 are formed on the underlying insulation layer 11. Specifically, the switching elements SW1 to SW3 are formed above the surface of the resin layer via the underlying insulation layer 11. These switching elements SW1 to SW3 are, for example, TFTs (thin-film transistors) each including a semiconductor layer SC as an active layer. The thickness of the semiconductor layer SC is, for example, 50 nm. The switching elements SW1 to SW3 have the same structure. In the description below, attention is paid to the switching element SW1, and the structure thereof is described more specifically.

The switching element SW1 is of a top gate type, but this is merely an example and a structure of a bottom gate type is not excluded. However, in the top gate type, since the semiconductor layer, in particular, a part thereof serving as a channel region, is put in direct contact with the underlying insulation layer 11, the structure of the underlying insulation layer 11 illustrated in the present embodiment is more suitable. In this embodiment, the semiconductor layer SC is formed of p-Si. However, the semiconductor layer SC can be formed of a material other than p-Si, and may be formed of a-Si or an oxide semiconductor formed of an oxide including at least one of indium (In), gallium (Ga) and zinc (Zn). The oxide semiconductor can be formed in a process at lower temperatures than the a-Si or p-Si. In particular, an oxide semiconductor, such as IGZO, is preferable in that the investment cost of manufacturing equipment can be reduced since a manufacturing apparatus, which is used for fabricating TFTs including a-Si semiconductor layers, can also be used as such.

The semiconductor layer SC is formed on the underlying insulation layer 11, and is covered with a second insulation film 12. The second insulation film 12 is a gate insulation film and is also disposed on the underlying insulation layer 11. A gate electrode WG of the switching element SW1 is formed on the second insulation film 12. The gate electrode WG is covered with a third insulation film 13. The third insulation film 13 is also disposed on the second insulation film 12.

A source electrode WS and a drain electrode WD of the switching element SW1 are formed on the third insulation film 13. The source electrode WS and drain electrode WD are put in contact with the semiconductor layer SC. The source electrode WS and drain electrode WD are covered with a fourth insulation film 14. The fourth insulation film 14 is also disposed on the third insulation film 13.

The organic EL elements OLED1 to OLED3 are formed on the fourth insulation film 14. In the example illustrated, the organic EL element OLED1 is electrically connected to the switching element SW1, the organic EL element OLED2 is electrically connected to the switching element SW2, and the organic EL element OLED3 is electrically connected to the switching element SW3.

The color of emission light of each of the organic EL elements OLED1 to OLED3 is white. In addition, each of the organic EL elements OLED1 to OLED3 is configured as a top emission type which emits light toward the counter-substrate CT. The organic EL elements OLED1 to OLED3 have the same structure.

The organic EL element OLED1 includes an anode PE1 which is formed on the fourth insulation film 14. The anode PE1 is in contact with the drain electrode WD of the switching element SW1 and is electrically connected to the switching element SW1. Similarly, the organic EL element OLED2 includes an anode PE2 which is electrically connected to the switching element SW2, and the organic EL element OLED3 includes an anode PE3 which is electrically connected to the switching element SW3. The anodes PE1 to PE3 may be formed of, for example, a transparent, electrically conducive material such as indium tin oxide (ITO) or indium zinc oxide (IZO), or may be formed of a metallic material such as aluminum (Al), magnesium (Mg), silver (Ag), titanium (Ti), or an alloy thereof, or a multilayer material thereof. In the case of the top emission type, it is desirable that the anodes PE1 to PE3 be formed of a metallic material with a high reflectivity.

The organic EL elements OLED1 to OLED3 further include an organic light emission layer ORG and a cathode CE. The organic light emission layer ORG is located on the anodes PE1 to PE3. The organic light emission layer ORG is continuously formed, without a break, over the organic EL elements OLED1 to OLED3. The cathode CE is located on the organic light emission layer ORG. In addition, the cathode CE is continuously formed, without a break, over the organic EL elements OLED1 to OLED3. The cathode CE is formed of, for example, a transparent, electrically conductive material such as ITO or IZO.

Specifically, the organic EL element OLED1 is composed of the anode PE1, organic light emission layer ORG and cathode CE. Similarly, the organic EL element OLED2 is composed of the anode PE2, organic light emission layer ORG and cathode CE, and the organic EL element OLED3 is composed of the anode PE3, organic light emission layer ORG and cathode CE.

In the organic EL elements OLED1 to OLED3, a hole-injection layer or a hole-transport layer may be further provided between each of the anodes PE1 to PE3 and the organic light emission layer ORG, and an electron-injection layer or an electron-transport layer may be further provided between the organic light emission layer ORG and the cathode CE.

The organic EL elements OLED1 to OLED3 are partitioned by ribs 15. The ribs 15 are formed on the fourth insulation film 14 and cover the edges of the anodes PE1 to PE3. Although not described in detail, the ribs 15 are formed, for example, in a grid shape or in a stripe shape on the fourth insulation film 14. The ribs 15 are covered with the organic light emission layer ORG. Specifically, the organic light emission layer ORG extends over not only the anodes PE1 to PE3 but also over the ribs 15.

The counter-substrate CT is formed by using a transparent resin layer 30. The counter-substrate CT includes a first color filter 31, a second color filter 32 and a third color filter 33 above an inner surface 30A of the resin layer 30.

The resin layer 30 is a transparent insulative substrate, which is formed of, for example, a material containing a polyimide (PI) as a main component. The resin layer 30 has a thickness of, e.g. 5 to 30 μm. As the material of the resin layer 30, the same material as the resin layer 10 is applicable. In particular, since light emitted from the top-emission type organic EL elements OLED1 to OLED3 passes through the resin layer 30, it is desirable that the resin layer 30 be formed of a material with high transparency.

The first color filter 31 is opposed to the organic EL element OLED1 and passes a light component of a blue wavelength of white light. The second color filter 32 is opposed to the organic EL element OLED2 and passes a light component of a green wavelength of white light. The third color filter 33 is opposed to the organic EL element OLED3 and passes a light component of a red wavelength of white light. A boundary between the first color filter 31 and second color filter 32, a boundary between the second color filter 32 and third color filter 33 and a boundary between the first color filter 31 and third color filter 33 are located above the ribs 15.

The array substrate AR and counter-substrate CT are attached by a transparent adhesive 40. Specifically, the adhesive 40 is interposed between the organic EL element OLED1 and first color filter 31, between the organic EL element OLED2 and second color filter 32 and between the organic EL element OLED3 and third color filter 33. In the meantime, a barrier film (sealing film), which protects the organic EL elements OLED1 to OLED3 from contaminants such as moisture, oxygen and hydrogen, may be disposed between the cathode and the adhesive 40.

According to the organic EL display device DA, when each of the organic EL elements OLED1 to OLED3 has emitted light, this radiated light (white light) is emitted to the outside through the first color filter 31, second color filter 32 or third color filter 33. At this time, a light component of a blue wavelength of the white light, which has been radiated from the organic EL element OLED1, passes through the first color filter 31. In addition, a light component of a green wavelength of the white light, which has been radiated from the organic EL element OLED2, passes through the second color filter 32. A light component of a red wavelength of the white light, which has been radiated from the organic EL element OLED3, passes through the third color filter 33. Thereby, color display is realized.

Next, the underlying insulation layer 11 is described in detail.

As illustrated in FIG. 2, the underlying insulation layer 11 is formed on the surface of the resin layer 10. The underlying insulation layer 11 includes a three-layer multilayer structure of a first silicon oxide film 1, a silicon nitride film 2 and a second silicon oxide film 3. In this embodiment, the underlying insulation layer 11 is formed of these three layers alone.

The first silicon oxide film 1 is formed on the surface of the resin layer 10 by using $SiO_2$. Thus, in the underlying insulation layer 11, the layer that is in contact with the resin layer 10 is the first silicon oxide film 1. The thickness of the first silicon oxide film 1 is, for example, 50 nm.

The silicon nitride film 2 is formed above the first silicon oxide film 1 by using $SiN_X$. In this embodiment, the silicon nitride film 2 is formed on the first silicon oxide film 1. The thickness of the silicon nitride film 2 is, for example, 50 nm.

The second silicon oxide film 3 is formed above the silicon nitride film 2 by using $SiO_2$. In this embodiment, the second silicon oxide film 3 is formed on the silicon nitride film 2. Thus, in the underlying insulation layer 11, the layer that is in contact with the semiconductor layer SC, which functions as the active layer of the switching element (TFT), is the second silicon oxide film 3. The thickness of the second silicon oxide film 3 is, for example, 300 nm.

Next, a description is given of an example of a method of manufacturing the organic EL display device DA of the present embodiment.

As illustrated in FIG. 2, to start with, a glass substrate 100 is prepared as a support substrate. Subsequently, the glass substrate 100 is washed (brush washing). Then, a polyimide precursor compound, which is a varnish-like composition, is coated with a thickness of 5 to 30 μm on the glass substrate 100 (slit coating) by using a film-forming device such as a slit coater. Thereafter, the polyimide precursor compound is cured by heat treatment at 480° C. for one hour. Thus, a resin layer 10 is formed.

Following the above, the glass substrate 100, on which the resin layer 10 is formed, is placed in a reaction chamber of a parallel-plate-type plasma CVD apparatus. Then, in a state in which the temperature of the glass substrate 100 is about 400° C., four layers, namely a first silicon oxide film 1 with a thickness of 50 nm, a silicon nitride film 2 with a thickness of 50 nm, a second silicon oxide film 3 with a thickness of 300 nm and an a-Si layer 5 with a thickness of 50 nm, are successively formed in order on the glass substrate 100, while supply gases into the reaction chamber are being switched.

The first silicon oxide film 1 is formed on the resin layer 10 by plasma decomposition of a mixture gas of $SiH_4$ gas and $N_2O$ gas. The silicon nitride film 2 is formed on the first silicon oxide film 1 by plasma decomposition of a mixture gas of $SiH_4$ gas and $NH_3$ gas. The second silicon oxide film 3 is formed on the silicon nitride film 2 by plasma decomposition of a mixture gas of $SiH_4$ gas and $N_2O$ gas. The a-Si layer 5 is formed on the second silicon oxide film 3 by plasma decomposition of $SiH_4$ gas.

From the above, the above-described four layers can be successively formed by continuing to flow $SiH_4$ gas, and switching the sub-gases. Thus, with the tact time being hardly increased, the underlying insulation layer 11 (underlying insulation layer 11 and a-Si layer 5) can be formed.

Thereafter, the a-Si layer 5 is patterned, the patterned a-Si is irradiated with a laser beam, etc., and the a-Si is polycrystallized. Incidentally, it is advantageous that the amount of hydrogen in the a-Si layer 5 is small, since no bumping or the like will occur. Normally, in a heating step after the film formation, hydrogen is discharged to the outside of the a-Si layer 5. If the tact time is taken into account, it is better that the initial amount of hydrogen is small. Thus, it is desirable that the a-Si layer 5 be formed at as high as possible temperatures.

As illustrated in FIG. 1 and FIG. 2, subsequently, by using p-Si formed on the underlying insulation layer 11, switching elements SW1 to SW3 are formed on the underlying insulation layer 11 through an ordinary TFT fabrication process using low-temperature p-Si. In addition, on the underlying insulation layer 11, not only the switching elements, but also a second insulation film 12, a third insulation film 13 and a fourth insulation film 14 are formed, and at the same time various wirings are formed.

Then, on the fourth insulation film 14, organic EL elements OLED1 to OLED3 are formed. Specifically, after anodes PE1 to PE3 are formed on the fourth insulation film 14, ribs 15 are formed, and an organic light emission layer ORG and a cathode CE are formed. Where necessary, a sealing film is formed on the organic EL elements OLED1 to OLED3.

On the other hand, although not illustrated, a glass substrate, which is different from the above-described glass substrate 100, is prepared as a support substrate. Subsequently, the glass substrate is washed. Then, a polyimide precursor compound, which is a varnish-like composition, is coated with a thickness of 5 to 30 μm on the glass substrate by using a film-forming device such as a slit coater. Thereafter, the polyimide precursor compound is cured by heat treatment, and a resin layer 30 is formed.

Subsequently, a first color filter 31, a second color filter 32 and a third color filter 33 are formed on the resin layer 30. Thereafter, an adhesive 40 is coated on the surfaces of the first to third color filters 31 to 33.

Next, the glass substrate 100 and the glass substrate, on which the first to third color filters 31 to 33 are formed, are attached. Specifically, the surface of the array substrate AR on that side, on which the organic EL elements OLED1 to OLED3 are located, and the surface of the counter-substrate CT on that side, on which the first to third color filters 31 to 33 are located, are bonded by the adhesive 40.

Thereafter, the glass substrate 100 is peeled from the resin layer 10, and the other glass substrate is peeled from the resin layer 30, thus removing the two glass substrates.

Thereby, the organic EL display device DA of the present embodiment is manufactured.

According to the organic EL display device DA of the first embodiment with the above-described structure, the organic EL display device DA comprises the underlying insulation layer 11 formed on the surface of the resin layer 10, and the switching elements SW1 to SW3 formed above the surface of the resin layer 10 via the underlying insulation layer 11.

The underlying insulation layer 11 includes the first silicon oxide film 1. In the underlying insulation layer 11, the first silicon oxide film 1 is in contact with the resin layer 10. When the first silicon oxide film 1 is formed, since the mixture gas including $N_2O$ gas is supplied into the reaction chamber, the surface of the resin layer 10, which is heated at a high temperature of about 400° C., is hardly exposed to a reducing atmosphere. Thereby, a change in quality of the resin layer 10 (in particular, the surface of the resin layer 10) can be reduced, and the flexibility of the resin layer 10 can be maintained.

The underlying insulation layer 11 includes the silicon nitride film 2 formed above the first silicon oxide film 1. When the silicon nitride film 2 is formed, since the resin layer 10 is covered with the first silicon oxide film 1, the flexibility of the resin layer 10 can be maintained. Since the silicon nitride film 2 has an excellent ion-blocking property, contamination of the switching elements SW1 to SW3 (the semiconductor layers SC) can be prevented.

The underlying insulation layer 11 includes the second silicon oxide film 3 formed above the silicon nitride film 2. In the underlying insulation layer 11, the second silicon oxide film 3 is in contact with the active layers (semiconductor layers SC) of the switching elements SW1 to SW3. The semiconductor layer SC is provided, not immediately above the silicon nitride film 2, but above the silicon nitride film 2 via the second silicon oxide film 3. The second silicon oxide film 3 can prevent supply of nitrogen atoms (excess nitrogen) from the silicon nitride film 2 into the semiconductor layer SC. Thereby, it becomes possible to prevent an adverse effect on the electrical characteristics of the switching elements SW1 to SW3 (semiconductor layers SC).

From the above, the organic EL display device DA with excellent flexibility and product reliability can be obtained.

Next, a display device of a second embodiment is described. In this embodiment, the same functional parts as in the above-described first embodiment are denoted by like reference numerals, and a detailed description thereof is omitted.

As illustrated in FIG. 3 and FIG. 2, in this embodiment, organic EL display devices DA of Examples 1 to 4 are described.

EXAMPLE 1

The organic EL display device DA of Example 1 is formed like the organic EL display device DA of the first embodiment. Incidentally, the thickness of the first silicon oxide film 1 is 50 nm.

EXAMPLE 2

The organic EL display device DA of Example 2 is formed like the organic EL display device DA of the first embodiment, except for the thickness of the first silicon oxide film 1. Incidentally, the thickness of the first silicon oxide film 1 is 10 nm.

EXAMPLE 3

The organic EL display device DA of Example 3 is formed like the organic EL display device DA of the first embodiment, except for the thickness of the first silicon oxide film 1. Incidentally, the thickness of the first silicon oxide film 1 is 30 nm.

EXAMPLE 4

The organic EL display device DA of Example 4 is formed like the organic EL display device DA of the first embodiment, except for the thickness of the first silicon oxide film 1. Incidentally, the thickness of the first silicon oxide film 1 is 100 nm.

Next, the flexibility of each of the organic EL display devices DA of Examples 1 to 4 is evaluated. In this embodiment, the evaluation of the flexibility was conducted at a stage at which the organic EL display device DA was fabricated halfway up to a fabrication step (i.e. formation of a-Si layer 5). The reason for this is that the evaluation of the flexibility is sufficient if the manufacturing process progresses to this stage. In addition, for the purpose of comparison with the flexibility of each of the organic EL display devices DA of Examples 1 to 4, the flexibility of each of organic EL display devices of Comparative Examples 1 to 3 was also evaluated.

In Examples 1 to 4, at a time point when the multilayer member of the resin layer 10, underlying insulation layer 11 and a-Si layer 5 was formed on the glass substrate 100, the glass substrate 100 was peeled from the resin layer 10, and the flexibility of the taken-out multilayer member was evaluated.

In Comparative Example 1, at a time point when the resin layer 10 of the above-described first embodiment was formed on the glass substrate 100, the glass substrate 100 was peeled from the resin layer 10, and the flexibility of the taken-out resin layer 10 alone was evaluated.

In Comparative Example 2, at a time point when the multilayer member of the resin layer 10 and second silicon oxide film 3 of the above-described first embodiment was formed on the glass substrate 100, the glass substrate 100 was peeled from the resin layer 10, and the flexibility of the taken-out multilayer member was evaluated. Incidentally, the multilayer member of Comparative Example 2 is formed without the first silicon oxide film 1 and silicon nitride film 2.

In Comparative Example 3, at a time point when the multilayer member of the resin layer 10, silicon nitride film 2, second silicon oxide film 3 and a-Si layer 5 of the above-described first embodiment was formed on the glass substrate 100, the glass substrate 100 was peeled from the resin layer 10, and the flexibility of the taken-out multilayer member was evaluated. Incidentally, the multilayer member of Comparative Example 3 is formed without the first silicon oxide film 1.

Next, a description is given of a jig which is used for the evaluation of an evaluation object such as the above-described multilayer member.

Figure 4:
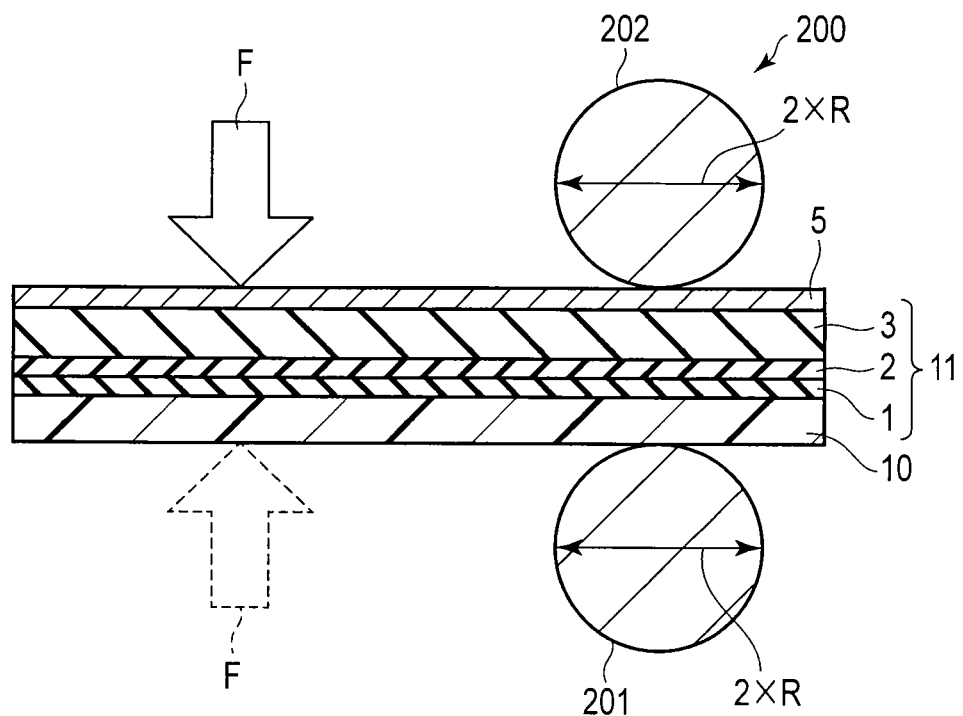
FIG. 4 is a cross-sectional view illustrating a jig of the second embodiment, FIG. 4 also illustrating a multilayer member of a resin layer, an underlying insulation layer and an a-Si layer.

As illustrated in FIG. 4, a jig 200 includes a pair of rods 201, 202. The rods 201 and 202 are provided in parallel with a predetermined interval. The cross-sectional shape of the rod 201, 202 is a circle (perfect circle). The interval between the rods 201 and 202 is adjustable, and may be adjusted such that the evaluation object is fixed, or such that the evaluation object can be passed between the rods 201 and 202. In addition, as the rods 201 and 202, a plurality of kinds of rods with different diameters may be changed and used. In the present case, the diameter of the rod 201, 202 is 2 R.

When the flexibility of the evaluation object is evaluated by using the jig 200 illustrated in FIG. 4, the evaluation object is inserted between the rods 201 and 202, and the evaluation object is clamped and fixed between the rods 201 and 202. Then, the evaluation object is bent by 180°, and a minimum bend radius of the evaluation object at a time when no plastic deformation occurred in the evaluation object is defined as a minimum bend R. Based on the value of the minimum bend R, the flexibility of the evaluation object is evaluated.

In addition, when the minimum bend R is evaluated (measured), the evaluation is performed by applying an initial stress F in an upward direction or a downward direction in the Figure. When a downward minimum bend R is evaluated, the evaluation object can be bent downward by 180° by putting the evaluation object in close contact with half the periphery of the rod 201 by, for example, applying a downward initial stress F. Similarly, when an upward minimum bend R is evaluated, the evaluation object can be bent upward by 180° by putting the evaluation object in close contact with half the periphery of the rod 202 by, for example, applying an upward initial stress F. At this time, by gradually decreasing the diameter of the rod 201, 202 and evaluating (inspecting) the presence/absence of plastic deformation in the evaluation object, the minimum bend R can be found.

As shown in FIG. 3, the minimum bend R of the multilayer member of each of Examples 1 to 4 was at least 2 mm in each of the downward direction and upward direction. Thereby, it was understood that the multilayer member of each of Examples 1 to 4 was excellent in flexibility.

In addition, the minimum bend R of each of the resin layer 10 of Comparative Example 1 and the multilayer member of Comparative Example 2 was at least 2 mm in each of the downward direction and upward direction. From this, it was understood that each of the resin layer 10 of Comparative Example 1 and the multilayer member of Comparative Example 2 was excellent in flexibility.

However, in the multilayer member of Comparative Example 3, the downward minimum bend R was 25 mm and the upward minimum bend R was 30 mm. From this, it is understood that the flexibility of the multilayer member of Comparative Example 3 is lost. In addition, from the fact that the upward minimum bend R is greater than the downward minimum bend R, it is understood that the resin layer 10 (in particular, the surface of the resin layer 10) changed in quality and the flexibility of the resin layer 10 was lost.

According to the organic EL display device DA of the second embodiment with the above-described structure, the organic EL display device DA comprises the underlying insulation layer 11 formed on the surface of the resin layer 10, and the switching elements SW1 to SW3. The underlying insulation layer 11 includes the first silicon oxide film 1, silicon nitride film 2 and second silicon oxide film 3.

Not only in the case where the thickness of the first silicon oxide layer 1 is 50 nm, but also in the case where the thickness is any one of 10 nm, 30 nm and 100 nm, the flexibility of the resin layer 10 can be maintained. Thus, in order to maintain the flexibility of the resin layer 10 (organic EL display device DA), it is preferable that the thickness of the first silicon oxide film 1 is 10 nm or more, and 100 nm or less.

Incidentally, in order to maintain the flexibility of the resin layer 10 (organic EL display device DA), the thickness of the first silicon oxide film 1 may exceed 100 nm. However, as the first silicon oxide film 1 becomes thicker, this leads to an increase in time of film formation and loss of uniformity in thickness.

Besides, in the second embodiment, the same advantageous effects as in the first embodiment can be obtained.

From the above, the organic EL display device DA with excellent flexibility and product reliability can be obtained.

Next, a display device of a third embodiment is described. In this embodiment, the same functional parts as in the above-described first embodiment are denoted by like reference numerals, and a detailed description thereof is omitted.

Figure 5:
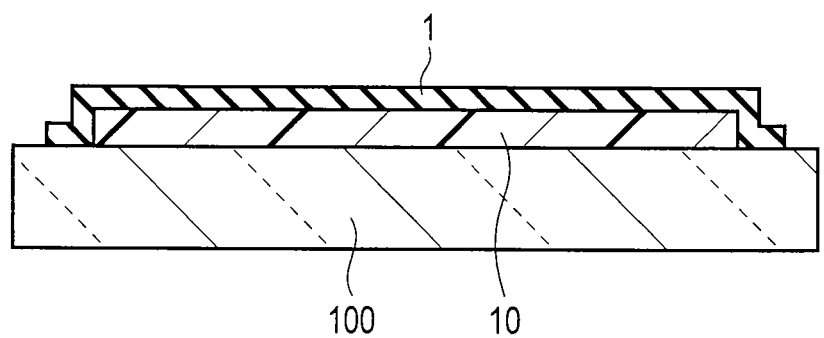
FIG. 5 is a cross-sectional view which schematically illustrates a part of a display device of a third embodiment, FIG. 5 illustrating a glass substrate, a resin layer and a first silicon oxide film.

As illustrated in FIG. 5, the organic EL display device DA is formed like the above-described first embodiment. When the organic EL display device DA is manufactured, a first silicon oxide film 1 is formed so as to completely cover the resin layer 10.

Incidentally, although not illustrated, not only the first silicon oxide film 1, but all of the first silicon oxide film 1, silicon nitride film 2 and second silicon oxide film 3 are formed so as to completely cover the resin layer 10. A peripheral edge portion of the first silicon oxide film 1 is located on the glass substrate 100 and adhered to the glass substrate 100. The first silicon oxide film 1 is provided on the glass substrate 100 such that a predetermined distance (e.g. several mm) is provided between the outer peripheral edge of the first silicon oxide film 1 and the outer peripheral edge of the glass substrate 100.

According to the organic EL display device DA of the third embodiment with the above-described structure, the organic EL display device DA comprises the underlying insulation layer 11 formed on the surface of the resin layer 10, and the switching elements SW1 to SW3. The underlying insulation layer 11 includes the first silicon oxide film 1, silicon nitride film 2 and second silicon oxide film 3. The organic EL display device DA of the third embodiment is formed like the organic EL display device DA of the above-described first embodiment. Thus, in the third embodiment, the same advantageous effects as in the first embodiment can be obtained.

The first silicon oxide film 1 is formed so as to completely cover the resin layer 10. Thus, a change in quality can be reduced also at the peripheral edge part of the resin layer 10.

The peripheral edge part of the first silicon oxide film 1 is located on the glass substrate 100. $SiO_2$ is excellent in adhesivity to glass. Thus, undesired peeling of the resin layer 10 from the glass substrate 100 can be reduced in the manufacturing process.

The first silicon oxide film 1 is formed such that a predetermined distance is provided between the outer peripheral edge of the first silicon oxide film 1 and the outer peripheral edge of the glass substrate 100. It is thus possible to reduce the occurrence of peeled matter (waste matter) of the first silicon oxide film 1, etc., which tends to easily occur when the first silicon oxide film 1, etc. are formed up to the outer peripheral edge of the glass substrate 100 or the vicinity of the outer peripheral edge.

From the above, the organic EL display device DA with excellent flexibility and product reliability can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the thickness of the second silicon oxide film 3 is not limited to 300 nm, and can be variously changed. In order to avoid an adverse effect on the electrical characteristics of the switching elements SW1 to SW3 (semiconductor layers SC), it is preferable that the thickness of the second silicon oxide film 3 is 100 nm or more, and 500 nm or less. In addition, the second silicon oxide film 3 is irradiated with a laser beam, or is heated. From the above, too, it is preferable that the thickness of the second silicon oxide film 3 is 100 nm or more.

In the meantime, the thickness of the second silicon oxide film 3 may be less than 100 nm. However, as the second silicon oxide film 3 becomes thinner, an adverse effect tends to be easily occur on the electrical characteristics of the switching elements SW1 to SW3 (semiconductor layers SC).

In addition, the thickness of the second silicon oxide film 3 may exceed 500 nm. However, as the second silicon oxide film 3 becomes thicker, this leads to an increase in time of film formation and loss of uniformity in thickness.

If the underlying insulation layer 11 includes the three-layer multilayer structure of the first silicon oxide film 1 which is in contact with the resin layer 10, the silicon nitride film 2 formed above the first silicon oxide film 1, and the second silicon oxide film 3 which is formed above the silicon nitride film 2 and is in contact with the active layers (semiconductor layers SC) of the switching elements SW1 to SW3, the above-described advantageous effects can be obtained. Thus, in the underlying insulation layer 11, the above-described three layers may not be successively stacked and formed. For example, the underlying insulation layer 11 may be formed of the first silicon oxide film 1, the silicon nitride film 2 formed on the first silicon oxide film 1, another proper film (e.g. silicon oxynitride film) formed on the silicon nitride film 2, and the second silicon oxide film 3 formed on the another proper film.

It should suffice if the underlying insulation layer 11 is formed on a resin layer surface, such as the surface of the resin layer 10. For example, the organic EL display device DA may further include a glass substrate 100. In this case, the organic EL display device DA may be formed without peeling the resin layer 10 from the glass substrate 100. Besides, the organic EL display device DA may include a plastic substrate (resin substrate) in place of the resin layer 10. In this case, it should suffice if the underlying insulation layer 11 is formed on the surface of the plastic substrate.

The semiconductor layer SC may be formed of a semiconductor material other than p-Si. For example, the semiconductor layer SC may be formed of a-Si.

The colors of emission lights of the organic EL elements OLED1 to OLED3 are not limited to white, and may be, for instance, red, green and blue. In this case, the organic EL display device DA can emit (display) red light, green light and blue light, without the first color filter 31, second color filter 32 and third color filter 33.

The embodiments of the present invention are not limited to the application to the above-described organic EL display device DA. The embodiments are also applicable to other organic EL display devices (e.g. a bottom-emission-type organic EL display device, and an organic EL device in which light emission layers of RGB are formed by selective coating), or display devices (e.g. a display device using a liquid crystal element, or an electrophoresis element) other than organic EL display devices. For example, the self-luminous element is not limited to a diode (organic EL diode), and use may be made of various display elements which are configured to be self-luminous. Needless to say, the above-described embodiments are applicable to display devices ranging from small/middle-sized display devices to large-sized display devices, without particular restrictions.

What is claimed is:

1. A display device comprising:
   an underlying insulation layer formed on an upper surface of a resin layer; and
   a thin-film transistor comprising an active layer which is formed above the upper surface of the resin layer,
   wherein the underlying insulation layer consists of a three-layer multilayer structure of a first silicon oxide film, a silicon nitride film formed above the first silicon oxide film, and a second silicon oxide film formed above the silicon nitride film,
   wherein in the underlying insulation layer the first silicon oxide film is in contact with the resin layer and the second silicon oxide film is in contact with the active layer of the thin-film transistor, and
   wherein the upper surface of the resin layer and a peripheral surface of the resin layer, but not a bottom surface of the resin layer, are covered with the first silicon oxide film.

2. The display device of claim 1, wherein the active layer is formed of polysilicon.

3. The display device of claim 1, wherein the first silicon oxide film has a thickness of 10 nm or more, and 100 nm or less.

4. The display device of claim 1, wherein the second silicon oxide film has a thickness of 100 nm or more, and 500 nm or less.

5. The display device of claim 1, wherein the resin layer comprises a polyimide.

6. The display device of claim 1, wherein the resin layer comprises a polyamide-imide or a polyaramide.

7. The display device of claim 1, wherein the resin layer has a thickness of 5 to 30μm.

8. The display device of claim 1, wherein
   the resin layer has a thickness of 5 to 30 μm;
   the first silicon oxide film has a thickness of 10 nm or more and 100 nm or less; and
   the second silicon oxide film has a thickness of 100 nm or more and 500 or less.

9. The display device of claim 8, wherein the resin layer comprises a polyimide.

10. The display device of claim 8, wherein the resin layer comprises a polyamide-imide or a polyaramide.

11. The display device of claim 1, wherein the display device is prepared by a process comprising forming the resin layer on a glass substrate, then covering the upper surface of the resin layer and the peripheral surface of the resin layer with the first silicon oxide film to form a covered resin layer, and peeling the covered resin layer from the glass substrate.

* * * * *